United States Patent [19]

Exner

[11] 4,417,386
[45] Nov. 29, 1983

[54] METHOD FOR MOUNTING A SEMICONDUCTOR DEVICE IN A HOUSING

[75] Inventor: Klaus D. Exner, Unterhaching, Fed. Rep. of Germany

[73] Assignee: Siemens Aktiengesellschaft, Berlin and Munich, Fed. Rep. of Germany

[21] Appl. No.: 218,498

[22] Filed: Dec. 22, 1980

[30] Foreign Application Priority Data

Jan. 17, 1980 [DE] Fed. Rep. of Germany ....... 3001613

[51] Int. Cl.³ .............................................. H01L 7/24
[52] U.S. Cl. ....................................... 29/590; 29/589; 357/71; 357/81
[58] Field of Search ............... 357/81, 71, 72; 29/589, 29/590; 427/89, 91

[56] References Cited

U.S. PATENT DOCUMENTS

| | | | |
|---|---|---|---|
| 2,809,332 | 10/1957 | Sherwood | 357/72 |
| 3,617,821 | 11/1971 | Einthoven | 357/81 |
| 3,770,565 | 11/1973 | Schoolar | 357/72 |
| 3,794,517 | 2/1974 | Yperman et al. | 357/71 |
| 3,828,227 | 8/1974 | Millard et al. | 357/72 |
| 4,127,424 | 11/1978 | Ullery | 357/71 |
| 4,293,587 | 10/1981 | Trueblood | 357/71 |

OTHER PUBLICATIONS

Engelhard Data Sheet, Engelhard Industries–Electro Metallic, E. Newark, N.J., Jan. 1976.

*Primary Examiner*—John P. Sheehan
*Attorney, Agent, or Firm*—Herbert L. Lerner; Laurence A. Greenberg

[57] ABSTRACT

Method and apparatus for mounting a semiconductor device in a housing, which includes first providing a metallization on a part of the surface of the semiconductor body of the semiconductor device to be connected to the housing, subsequently permanently connecting the semiconductor body to a part of the housing being in the form of a substrate with an organic adhesive to which metal particles have been added, and connecting electrodes of the semiconductor device to terminals disposed in the housing.

9 Claims, 1 Drawing Figure

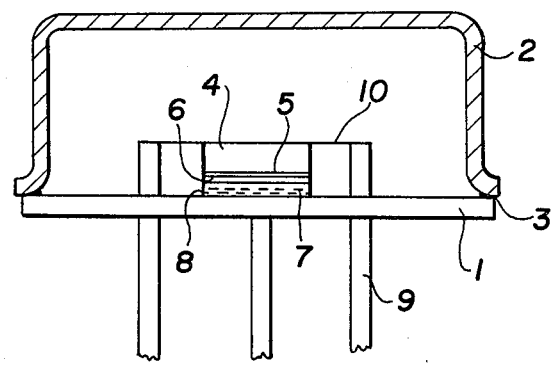

METHOD FOR MOUNTING A SEMICONDUCTOR DEVICE IN A HOUSING

The invention relates to a method and apparatus for mounting a semiconductor device, particularly a monolithically integrated semiconductor circuit, in a housing wherein the semiconductor body of the semiconductor device is permanently connected to a part of the housing provided as a substrate and is otherwise connected with its electrodes to the terminals in the housing provided for this purpose.

Such methods are generally in use. In one known method, the substrate, formed of metal, is connected with the interposition of a metal layer as solder, to a metallization which is applied to the rear side of the semiconductor body of the semiconductor device and serves, in particular, as an electrode. On the other hand, a metallization previously applied to the rear side of the semiconductor body can be dispensed with, and instead the rear side of the semiconductor body can be alloyed directly with the semiconductor body, using a solder suitable for this purpose to therefore obtain a permanent bond between the semiconductor body and the substrate which is to be connected thereto through the solder layer. Another possibility is to cement the rear of the semiconductor body to the substrate, using a suitable adhesive. The adhesive then is formed of a suitable organic material which is applied in liquid condition and then sets, for instance, through the use of a suitable temperature treatment.

Both methods can also be applied for the mounting of chips of integrated semiconductor circuits, which are fabricated particularly on the basis of monocrystalline silicon. The finished semiconductor systems are then mounted in suitable housings. To this end, the rear side of the semiconductor chip is firmly connected to the bottom plate of the housing by cementing, by soldering or by alloying, and the contact electrodes provided on the front side of the semiconductor chip are connected to respective external contacts or pins of the housing by a way of a fine wire.

The simplest and least expensive way of fastening chips is by cementing. However, there is the disadvantage that a cemented joint has considerably less heat conduction as compared with a fastening by soldering or alloying, with the result that the cementing technique is promising only for mounting systems with low dissipation. For this reason, semiconductor devices and particularly also IC's, in which appreciable heat development is expected in operation, are connected to the substrate formed of heat conducting material, by soldering or alloying.

This also has disadvantages, however. For one thing, the higher costs to be paid for a soldering or alloying connection become important. In addition, the solder layer or alloy layer fatigues under alternating stresses, which leads to a failure of the circuit. Alloying has the special disadvantage that the chip can already be partly heavily distorted in the assembly, which has an effect on the electrical functioning. With the two last-mentioned methods of making the connection, the difficulties increase with increasing chip area, which is not the case with a fastening by cementing.

It is accordingly an object of the invention to provide a method and apparatus for mounting a semiconductor device in a housing which overcomes the hereinaforementioned disadvantages of the heretofore-known methods and devices of this general type, and one which avoids these disadvantages to a large extent without the necessity of tolerating new disadvantages instead.

With the foregoing and other objects in view there is provided, in accordance with the invention, a method of mounting a semiconductor device in a housing, which comprises first providing a metallization on a part of the surface of the semiconductor body of the semiconductor device to be connected to the housing, subsequently permanently connecting the semiconductor body to a part of the housing being in the form of a substrate with an organic adhesive to which metal particles have been added, and connecting electrodes of the semiconductor device to terminals disposed in the housing.

In accordance with another mode of the invention there is provided a method which comprises using Z-silicone adhesive as the organic adhesive.

In accordance with a further mode of the invention there is provided a method which comprises providing silver as the metallization at least at parts thereof facing the substrate, and applying the metallization by one of the groups of steps consisting of vapor deposition and sputtering.

In accordance with an added mode of the invention there is provided a method which comprises providing the metallization at an elevated temperature.

In accordance with an additional mode of the invention there is provided a method which comprises providing silicon as the semiconductor body, and there is provided an intermediate metal layer corresponding to the type of the semiconductor used between the silicon layer and the monocrystalline semiconductor body as an adhesion agent.

In accordance with still another mode of the invention there is provided a method which comprises providing chromium as the intermediate metal layer.

In accordance with still a further mode of the invention there is provided a method which comprises applying the intermediate layer by one of the groups of steps consisting of vapor deposition and sputtering.

In accordance with still and added mode of the invention there is provided a method which comprises providing monocrystalline silicon as the semiconductor body, reducing the thickness of the semiconductor body by grinding the rear sides thereof, subsequently applying chromium as the intermediate metallic layer in vapor deposition equipment, subsequently applying the silver metallization on the chromium layer, using silver as the metal particles added to the adhesive and a heat-conducting material as the substrate, connecting the rear side of the semiconductor body after deposition and grinding to the heatconducting substrate with the adhesive, and subsequently hardening the adhesive by heat treatment.

In accordance with still an additional mode of the invention there is provided a method which comprises adjusting the metal content of the adhesive to at least 50 volume percent.

In accordance with again another mode of the invention there is provided a method which comprises diluting the adhesive with approximately 10 volume percent of an organic solvent.

With the foregoing and other objects in view there is also provided, in accordance with the invention, an apparatus for mounting a semiconductor device in a housing comprising a semiconductor body of the semiconductor device having a surface to be connected to the housing and having electrodes, terminals being extended through the housing and connected to the electrodes, a part of the housing being in the form of a substrate, a metallization disposed on the surface of the body to be connected to the housing, and an organic adhesive to which metal particles have been added, permanently connecting the semiconductor body to the substrate.

In accordance with an additional feature of the invention, the organic adhesive is Z-silicone adhesive.

In accordance with another feature of the invention at least a part of the metallization faces the substrate, and the part is silver.

In accordance with a further feature of the invention there is provided an intermediate metal layer disposed between the silver metallization and the body as an adhesion agent, the metal layer corresponding to the type of the semiconductor body.

In accordance with an added feature of the invention the metal is chromium.

In accordance with still an additional feature of the invention the substrate is in the form of a heat-conducting material, the metal particles added to the adhesive are silver, and the adhesive is hardenable by heat treatment.

In accordance with still another feature of the invention, the adhesive has a metal content of at least 50 volume percent.

In accordance with a concomitant feature of the invention, the adhesive is diluted with approximately 10 volume percent of an organic solvent.

A chrome-silver layer is advantageously used as a metallization for the part of the surface of the semiconductor device to be mounted, particularly if the semiconductor body is formed of monocrystalline silicon. This is the part of the device which is to be connected to the substrate. In addition, conductive silver particles are advantageously added to the organic substance, i.e. the adhesive, before it is applied. As an adhesive the Z-adhesive which is commercially available and to which, for instance, 50 to 70% by volume of silver particles have been added is suitable, among other things.

The thermal resistance $R_{th}$ of a semiconductor system mounted in accordance with the invention is not higher than if the respective system is fastened by soldering or alloying. Life tests have furthermore shown that the low thermal transfer resistance $R_{th}$ is also not destroyed by long-term alternating stresses.

Other features which are considered as characteristic for the invention are set forth in the appended claims.

Although the invention is illustrated and described herein as embodied in a method and apparatus for mounting a semiconductor device in a housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single figure of the drawing which is a fragmentary, diagrammatic cross-sectional view of a semiconductor device mounted in a housing in accordance with the method of the invention.

BRIEF DESCRIPTION OF THE DRAWING

The single FIGURE is a cross section of a semiconductor mounted in a housing in accordance with the method of this invention.

Referring now particularly to the single FIGURE of the drawing, there is seen a housing part or base 1 which is to be used as a substrate and is fastened to a cap 2 at a weld 3. The semiconductor device 4 is connected by wires 10 extending from the electrodes thereof to terminals 9 which pass through the base 1 and may be sealed thereto.

The practical embodiment of the method of the invention can be carried out as follows, using the device of the invention as an illustration:

First, the plate-shaped semiconductor body of the semiconductor device 4, which is formed particularly of monocrystalline silicon and is to be mounted, is taken down on the rear or lower side thereof which is to be connected to the substrate 1. This is done by grinding so far that a total thickness of about 180 μm remains.

Second, in vapor-deposition equipment, at about 300° C., the rear side of the wafer-shaped semiconductor body is provided with a chromium layer 5 being about 0.1 μm thick.

Third, immediately thereafter, (i.e., without opening the vapor deposition equipment), a silver layer 6 being approximately 1 μm thick is vapor-deposited on the chromium layer 5. It should be noted here that sufficiently good results are still obtained even with thinner silver layers, for instance with an Ag layer 6 being 0.5 μm thick. Because of constraints of size, the relative thicknesses of the layers in the drawing are not to scale. The silver layer may be used as a metallization on the body without requiring the chromium layer.

In a fourth step, the semiconductor device 4, which is then taken out of the vapor deposition equipment, is then fastened by means of a metal-containing adhesive 8, particularly a Z-adhesive, to the part 1 of the housing which is provided as the substrate and is formed of heat conducting material. It is noted that the substrate 1 is particularly a metallic housing base plate, and that a heat treatment of about 200° C. is advisable immediately after the cementing.

In the vapor deposition of the two metal layers 5, 6, constituting the fifth step, the vapor deposition rates, and thereby the roughness of the finally obtained surface of the metallization, must be matched to the size of the metal particles 7 provided in the adhesive 8 in such a manner that good area 1 contact is ensured between the surface of the silver metallization on the back of the chip and the metal particles provided in the adhesive. It is accordingly advantageous to use an adhesive to which metal particles that are as uniform as possible have been added. These are especially cylindrical or spherical conductive silver particles, the particle size being matched to the surface roughness of the silver layer 6. The metal content of the adhesive may be equal to or more than 50 volume percent. The chromium layer 5 serves as an adhesion substrate for the silver layer 6.

For the vapor deposition of the chromium layer 5, deposition rates of 300 Å/min. to 400 Å/min. are recommended and for the vapor deposition of the silver layer 6, deposition rates of 500 Å/min. and an adhesive 8 which contains cylindrical conductive silver particles 7 of 5 μm in diameter and 10 μm in length.

If the metallization is applied by sputtering, it may be possible to dispense with the intermediate chromium layer 5.

Besides the metal layers already mentioned, connecting layers formed of other metals may optionally be used as well. The first layer must then be chosen in such a manner that an electrically and mechanically satisfactory joint, corresponding to the doping of the rear side of the chip comes about. The second metal layer serves for matching the adhesive. It can be dispensed with if this match is already assured by the first metal layer.

As already indicated, the so-called Z-adhesive, i.e., a silicon adhesive, is suitable as the adhesive substance 8, is provided with the necessary content of metal particles and is diluted prior to application with about 10% of a suitable organic solvent.

There are claimed:

1. Method of mounting a semiconductor device in a housing, which comprises first providing a chromium layer on a part of the surface of the monocrystalline silicon semiconductor body of the semiconductor device to be connected to the housing, covering the chromium layer with a silver layer, subsequently permanently connecting the sliver layer on the chromium layer on the monocrystalline silicon semiconductor body to a part of the housing being in the form of a substrate with an adhesive to which silver particles have been added, and connecting electrodes of the semiconductor device with wire connections to terminals disposed in the housing.

2. Method according to claim 1, which comprises using Z-silicone adhesive as the adhesive.

3. Method according to claim 1 or 2, which comprises applying the silver layer by one of the groups of steps consisting of vapor deposition and sputtering.

4. Method according to claim 3, which comprises providing the silver layer at an elevated temperature.

5. Method according to claim 3, which comprises providing silicon as the semiconductor body.

6. Method according to claim 5, which comprises applying the chromium layer by one of the groups of steps consisting of vapor deposition and sputtering.

7. Method according to claim 6, which comprises providing monocrystalline silicon as the semiconductor body, reducing the thickness of the semiconductor body by grinding the rear side thereof, subsequently applying the chromium as an intermediate metallic layer in vapor deposition equipment, subsequently applying the silver metallization on the chromium layer, using a heat-conducting material as the substrate, connecting the rear side of the semiconductor body after deposition and grinding to the heat-conducting substrate with the adhesive, and subsequently hardening the adhesive by heat treatment.

8. Method according to claim 7, which comprises adjusting the metal content of the adhesive to at least 50 volume percent.

9. Method according to claim 2, which comprises diluting the adhesive with approximately 10 volume percent of an organic solvent.

* * * * *